(12) United States Patent
Guler et al.

(10) Patent No.: US 11,448,085 B2
(45) Date of Patent: Sep. 20, 2022

(54) REMOTE TEMPERATURE MEASUREMENT SYSTEM FOR GAS TURBINE ENGINE

(71) Applicant: United Technologies Corporation, Farmington, CT (US)

(72) Inventors: Urcan Guler, Avon, CT (US); Paul Sheedy, Bolton, CT (US); John A. Sharon, West Hartford, CT (US); Wayde R. Schmidt, Pomfret Center, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 291 days.

(21) Appl. No.: 16/679,627

(22) Filed: Nov. 11, 2019

(65) Prior Publication Data
US 2021/0140336 A1    May 13, 2021

(51) Int. Cl.
| | |
|---|---|
| G01K 11/20 | (2006.01) |
| H03B 5/30 | (2006.01) |
| F01D 17/08 | (2006.01) |
| G01K 13/08 | (2006.01) |
| B33Y 80/00 | (2015.01) |

(52) U.S. Cl.
CPC .......... F01D 17/085 (2013.01); G01K 11/20 (2013.01); G01K 13/08 (2013.01); B33Y 80/00 (2014.12); *F05D 2270/303* (2013.01); *F05D 2270/804* (2013.01); *G01K 2205/00* (2013.01); *H03B 5/30* (2013.01)

(58) Field of Classification Search
CPC ...... F01D 17/085; G01K 11/20; G01K 13/08; G01K 2205/00; B33Y 80/00; F05D 2270/303; F05D 2270/804
USPC ............................................................ 331/154
See application file for complete search history.

(56) References Cited

U.S. PATENT DOCUMENTS

| | | | | |
|---|---|---|---|---|
| 4,215,275 A | * | 7/1980 | Wickersheim | G01J 5/48 356/44 |
| 4,759,033 A | * | 7/1988 | Ariessohn | G01K 11/20 250/458.1 |
| 4,933,545 A | * | 6/1990 | Saaski | G01L 9/0079 250/227.14 |
| 5,086,220 A | * | 2/1992 | Berthold | G01J 5/0022 250/227.2 |
| 5,971,610 A | * | 10/1999 | Kolodner | G01K 11/20 374/137 |
| 6,278,809 B1 | | 8/2001 | Johnson et al. | |
| 6,364,524 B1 | * | 4/2002 | Markham | G01J 5/0022 374/131 |

(Continued)

FOREIGN PATENT DOCUMENTS

| | | | | |
|---|---|---|---|---|
| CN | 1867824 A | * | 11/2006 | ......... G01N 21/7746 |
| CN | 105675545 B | * | 3/2019 | |

(Continued)

*Primary Examiner* — Gail Kaplan Verbitsky
(74) *Attorney, Agent, or Firm* — Bachman & LaPointe, P.C.

(57) ABSTRACT

A remote temperature measurement system for a gas turbine engine includes an optical emitter/receiver in communication with the control system and a probe system embedded within a component of the gas turbine engine, the probe system within a line-of-sight of the optical emitter/receiver, the control system operable to determine a local temperature of the component in response to optical communication with the probe system.

12 Claims, 8 Drawing Sheets

(56) References Cited

U.S. PATENT DOCUMENTS

| | | | |
|---|---|---|---|
| 6,607,300 B1* | 8/2003 | Kleinerman | G01K 11/20 |
| | | | 250/483.1 |
| 7,582,359 B2* | 9/2009 | Sabol | F01D 17/02 |
| | | | 428/469 |
| 8,035,822 B2 | 10/2011 | Riza et al. | |
| 9,551,620 B2 | 1/2017 | Singh et al. | |
| 9,559,660 B2* | 1/2017 | Pensala | H03H 9/2405 |
| 10,006,304 B2* | 6/2018 | Schmidt | F01D 5/147 |
| 10,142,565 B2 | 11/2018 | Boudin et al. | |
| 10,677,088 B2* | 6/2020 | Lee | F01D 21/003 |
| 2006/0188000 A1* | 8/2006 | Bird | G01K 11/20 |
| | | | 374/161 |
| 2007/0284513 A1* | 12/2007 | Fan | G02B 6/4246 |
| | | | 250/216 |
| 2010/0066387 A1* | 3/2010 | Bosselmann | G01B 7/14 |
| | | | 324/644 |
| 2010/0321191 A1 | 12/2010 | Gong et al. | |
| 2011/0280279 A1* | 11/2011 | Gregory | G01K 7/343 |
| | | | 374/152 |
| 2012/0293647 A1* | 11/2012 | Singh | G06T 7/001 |
| | | | 348/82 |
| 2012/0296575 A1* | 11/2012 | McMillan | F01D 25/285 |
| | | | 702/40 |
| 2013/0068024 A1* | 3/2013 | Xu | G01B 15/00 |
| | | | 73/579 |
| 2013/0323054 A1* | 12/2013 | Kubel | F01D 17/02 |
| | | | 416/1 |
| 2017/0276020 A1* | 9/2017 | Lee | B64F 5/60 |
| 2018/0326487 A1 | 11/2018 | Casper et al. | |
| 2020/0145738 A1* | 5/2020 | Mantese | G06K 7/10188 |
| 2020/0308978 A1* | 10/2020 | Soto | G01K 13/08 |
| 2020/0391332 A1* | 12/2020 | Schleif | B23Q 1/015 |
| 2021/0055543 A1* | 2/2021 | Van Lierop | G01B 9/0205 |
| 2021/0180191 A1* | 6/2021 | Fouliard | G01K 11/20 |
| 2021/0270798 A1* | 9/2021 | Potyrailo | B61L 3/002 |

FOREIGN PATENT DOCUMENTS

| | | | | |
|---|---|---|---|---|
| CN | 109827678 A | * | 5/2019 | |
| CN | 110382140 A | * | 10/2019 | B22F 3/1055 |
| GB | 2069689 A | * | 8/1981 | G01B 11/14 |
| JP | 2007192699 A | * | 8/2007 | |
| JP | 2020004569 A | * | 1/2020 | |
| KR | 20070062562 A | * | 6/2007 | |

* cited by examiner

REMOTE TEMPERATURE MEASUREMENT SYSTEM FOR GAS TURBINE ENGINE

BACKGROUND

The present disclosure relates to a gas turbine engine and, more particularly, to a remote temperature measurement system to identify potential temperature affects to a component of the gas turbine engine.

Inspections are regularly performed on turbine blades and other components of aircraft engines to determine if any damage has occurred such that maintenance can be performed. Unexpected corrosion due to overheating can also potentially shorten turbine blade life, which may result in additional downtime. Exposure to excessive temperature can also cause microstructural evolution that can debit part properties like strength.

Contact sensors cannot withstand harsh environmental conditions, prohibit access to moving parts, and sometimes interfere with the environmental, performance and design parameters as they require direct physical contact.

SUMMARY

A remote temperature measurement system for a gas turbine engine according to one disclosed non-limiting embodiment of the present disclosure includes a control system; an optical emitter/receiver in communication with the control system; and a probe system embedded within a component of the gas turbine engine, the probe system within a line-of-sight of the optical emitter/receiver, the control system operable to determine a local temperature of the component in response to optical communication with the probe system.

A further embodiment of any of the foregoing embodiments of the present disclosure includes that the component is a rotor blade.

A further embodiment of any of the foregoing embodiments of the present disclosure includes that the probe system comprises a resonant probe in communication with an optical port via a waveguide.

A further embodiment of any of the foregoing embodiments of the present disclosure includes that the resonant probe and the waveguide are embedded below a surface of the component.

A further embodiment of any of the foregoing embodiments of the present disclosure includes that the optical port is within the line-of-sight of the optical emitter/receiver.

A further embodiment of any of the foregoing embodiments of the present disclosure includes that the resonant probe comprises thermographic phosphor films in which changes in temperature affects the luminescence of the thermographic phosphor films.

A further embodiment of any of the foregoing embodiments of the present disclosure includes that the resonant probe comprises a resonant probe that operates as an antenna for light.

A further embodiment of any of the foregoing embodiments of the present disclosure includes that the resonant probe comprises a material designed for resonance in a desired spectral region.

A further embodiment of any of the foregoing embodiments of the present disclosure includes that the resonant probe comprises dielectric materials designed for resonance in a desired spectral region.

A further embodiment of any of the foregoing embodiments of the present disclosure includes that the component is additively manufactured.

A probe system embedded within a component of the gas turbine engine, according to one disclosed non-limiting embodiment of the present disclosure includes a resonant probe; an optical port in a surface of the component; and a waveguide in communication with the resonant probe and the optical port.

A further embodiment of any of the foregoing embodiments of the present disclosure includes that the resonant probe further comprises a thermographic phosphor film in which changes in temperature affects the luminescence of the thermographic phosphor films and optical properties thereof.

A further embodiment of any of the foregoing embodiments of the present disclosure includes that the resonant probe comprises a nano/micro-structured resonator.

A further embodiment of any of the foregoing embodiments of the present disclosure includes that the resonant probe comprises dielectric materials designed for resonance in a spectral region of interest.

A method for remote temperature measurement of a component within a gas turbine engine according to one disclosed non-limiting embodiment of the present disclosure includes embedding a probe system within an additively manufactured component of the gas turbine engine; optically communicating with the probe system; and determining a local temperature of the component in response to optical communication with the probe system.

A further embodiment of any of the foregoing embodiments of the present disclosure includes that optically communicating with the probe system comprises communicating through an waveguide embedded in the additively manufactured component.

A further embodiment of any of the foregoing embodiments of the present disclosure includes that optically communication with the probe system comprises optical communication from a fixed frame of reference.

A further embodiment of any of the foregoing embodiments of the present disclosure includes that optical communication with the probe system comprises identifying a luminescence of a thermographic phosphor film.

A further embodiment of any of the foregoing embodiments of the present disclosure includes enhancing the temperature dependent response of the resonant probe with the thermographic phosphor films.

A further embodiment of any of the foregoing embodiments of the present disclosure includes that determining the local temperature of the component in response to optical communication with the probe system comprises utilizing at least one of a reflection mode and a luminescence mode.

The foregoing features and elements may be combined in various combinations without exclusivity, unless expressly indicated otherwise. These features and elements as well as the operation thereof will become more apparent in electromagnetic radiation of the following description and the accompanying drawings. It should be appreciated that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
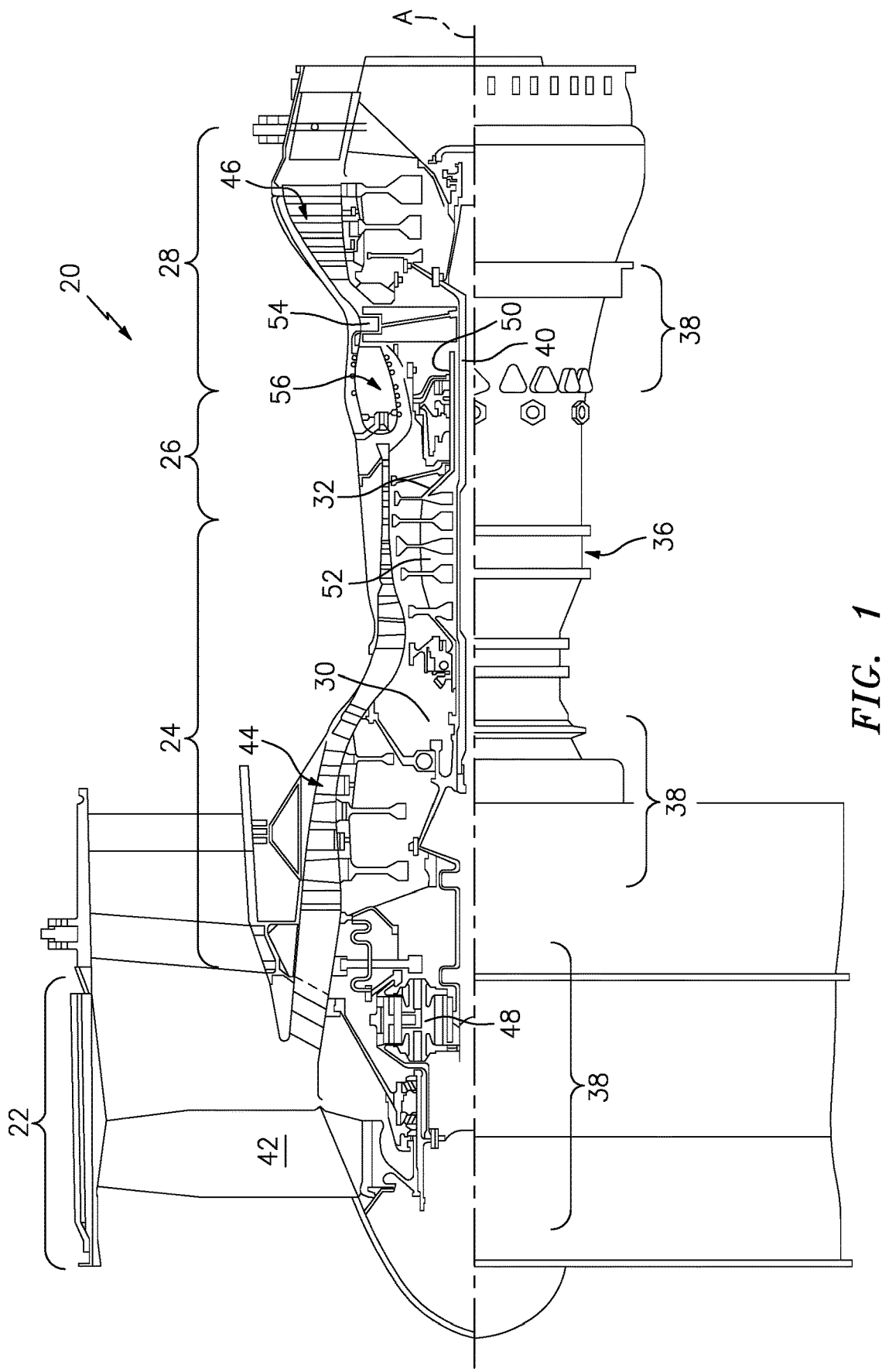
FIG. 1 is a schematic cross-section of an example low-bypass gas turbine engine with a serpentine intake duct.

FIG. 1 schematically illustrates a gas turbine engine 20. The gas turbine engine 20 is disclosed herein as a two-spool turbo fan that generally incorporates a fan section 22, a compressor section 24, a combustor section 26 and a turbine section 28. The fan section 22 drives air along a bypass flowpath while the compressor section 24 drives air along a core flowpath for compression and communication into the combustor section 26 then expansion through the turbine section 28. Although depicted as a turbofan in the disclosed non-limiting embodiment, it should be appreciated that the concepts described herein are not limited to use with turbofans as the teachings may be applied to other types of turbine engine architectures such as turbojets, turboshafts, and three-spool (plus fan) turbofans.

The engine 20 generally includes a low spool 30 and a high spool 32 mounted for rotation about an engine central longitudinal axis X relative to an engine static structure 36 via several bearing structures 38. The low spool 30 generally includes an inner shaft 40 that interconnects a fan 42, a low pressure compressor ("LPC") 44 and a low pressure turbine ("LPT") 46. The inner shaft 40 drives the fan 42 directly or through a geared architecture 48 to drive the fan 42 at a lower speed than the low spool 30. An exemplary reduction transmission is an epicyclic transmission, namely a planetary or star gear system.

The high spool 32 includes an outer shaft 50 that interconnects a high pressure compressor ("HPC") 52 and high pressure turbine ("HPT") 54. A combustor 56 is arranged between the high pressure compressor 52 and the high pressure turbine 54. The inner shaft 40 and the outer shaft 50 are concentric and rotate about the engine central longitudinal axis A which is collinear with their longitudinal axes.

Core airflow is compressed by the LPC 44 then the HPC 52, mixed with the fuel and burned in the combustor 56, then expanded over the HPT 54 and the LPT 46. The turbines 54, 46 rotationally drive the respective low spool 30 and high spool 32 in response to the expansion. The main engine shafts 40, 50 are supported at a plurality of points by bearing structures 38 within the static structure 36. It should be appreciated that various bearing structures 38 at various locations may alternatively or additionally be provided.

Figure 2:
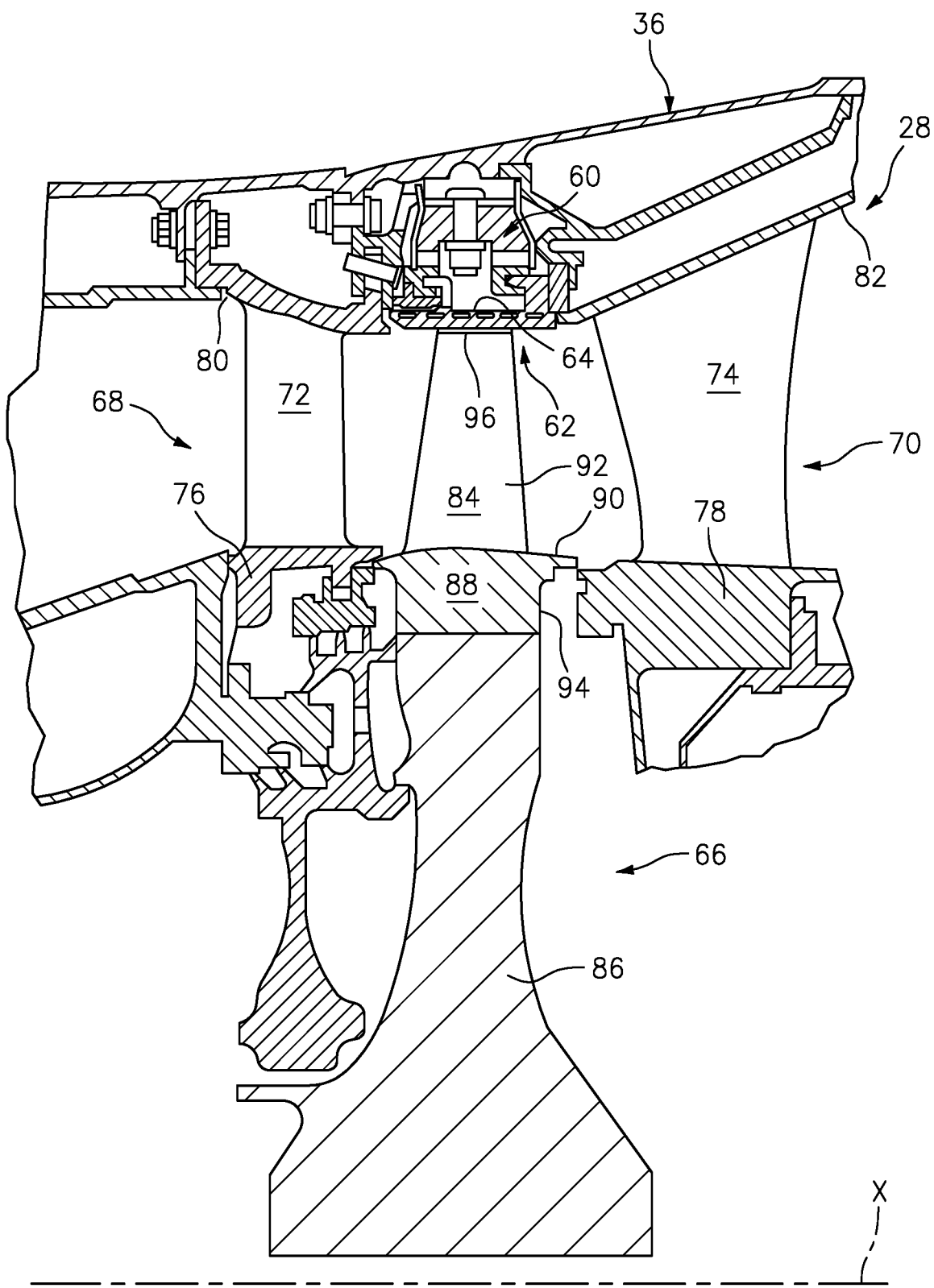
FIG. 2 is a schematic cross-section of an example high-bypass gas turbine engine with a remote temperature measurement system.

With reference to FIG. 2, an enlarged schematic view of a portion of the turbine section 28 is shown by way of example; however, other engine sections will also benefit herefrom. A full ring shroud assembly 60 within the engine case structure 36 supports a blade outer air seal (BOAS) assembly 62 with a multiple of circumferentially distributed BOAS 64 proximate to a rotor assembly 66 (one schematically shown).

The full ring shroud assembly 60 and the BOAS assembly 62 are axially disposed between a forward stationary vane ring 68 and an aft stationary vane ring 70. Each vane ring 68, 70 includes an array of vanes 72, 74 that extend between a respective inner vane platform 76, 78 and an outer vane platform 80, 82. The outer vane platforms 80, 82 are attached to the engine case structure 36.

The rotor assembly 66 includes an array of blades 84 circumferentially disposed around a disk 86. Each blade 84 includes a root 88, a platform 90 and an airfoil 92 (also shown in FIG. 3). The blade roots 88 are received within a rim 94 of the disk 86 and the airfoils 92 extend radially outward such that a tip 96 of each airfoil 92 is closest to the blade outer air seal (BOAS) assembly 62. The platform 90 separates a gas path side inclusive of the airfoil 92 and a non-gas path side inclusive of the root 88.

Figure 3:
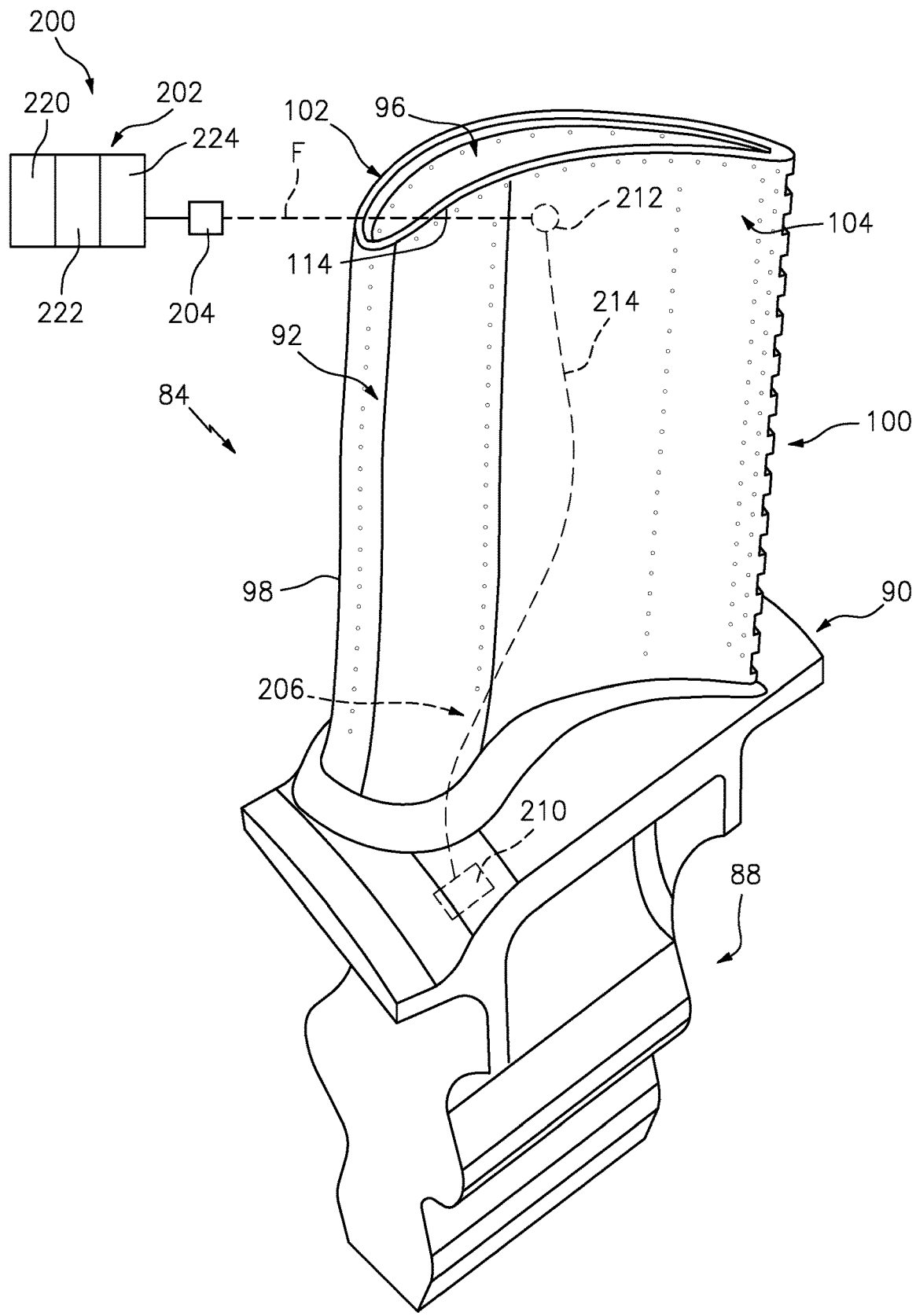
FIG. 3 is an expanded view of a turbine blade with a remote temperature measurement system.

With reference to FIG. 3, the platform 90 generally separates the root 88 and the airfoil 92 to define an inner boundary of a gas path. The airfoil 92 defines a blade chord between a leading edge 98, which may include various forward and/or aft sweep configurations, and a trailing edge 100. A first sidewall 102 that may be convex to define a suction side, and a second sidewall 104 that may be concave to define a pressure side are joined at the leading edge 98 and at the axially spaced trailing edge 100. The tip 96 extends between the sidewalls 102, 104 opposite the platform 90. It should be appreciated that the tip 96 may include a recessed portion.

A remote temperature measurement system 200 generally includes a control system 202, an optical emitter/receiver 204, and, in the blade 84, a probe system 206. Although the term "optical" is used throughout, other areas in the electromagnet region may be utilized. That is, the optical emitter/receiver 204 is in a fixed frame of reference adjacent to the blade 84. The optical emitter/receiver 204 can include a miniaturized spectroscope, or other such optical device. The optical emitter/receiver 204 may operate in at least one of a ultraviolet, visible, infrared, and microwave region of the electromagnetic spectrum.

The probe system 206 may include one or more resonant probes 210 that communicate with the optical emitter/receiver 204 via an optical port 212. The optical port 212 communicates with the resonant probe 210 via a waveguide 214.

The optical port 212 and the associated optical emitter/receiver 204 may be located remote from the resonant probe 210 within the blade 84. That is, temperature measurements may be taken in the blade 84 that are remote from the optical port 212 and the associated optical emitter/receiver 204 which may then be located in a relatively more benign environment. In one embodiment, the optical port 212 in each blade 84 may be located in a radial position such that multiple resonant probes 210 can communicate with the optical emitter/receiver 204 as the blades rotate thereby to place each optical port 212 within a field of view F of the optical emitter/receiver 204.

Figure 4:
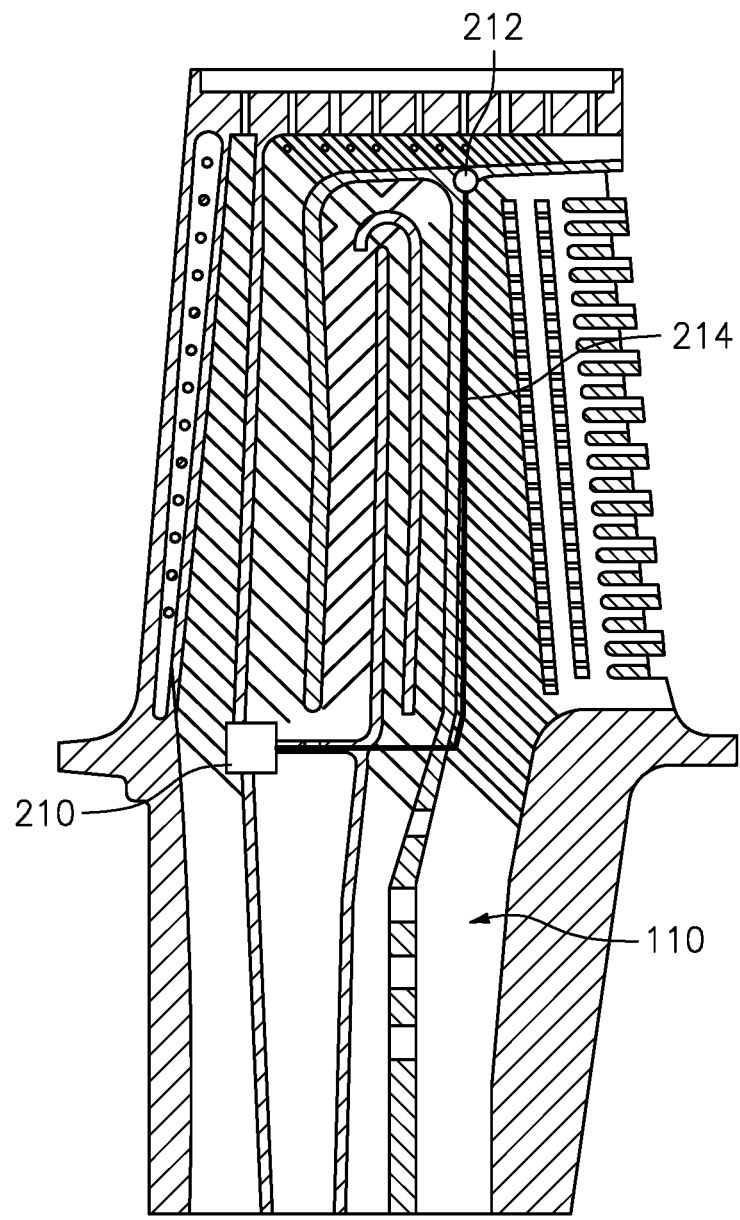
FIG. 4 is a sectional view of the turbine blade with the remote temperature measurement system.

Each blade 84 may be formed by additive manufacturing which readily permits installation of the probe system 206 during the additive manufacture process. It should be appreciated that although a blade 84 with an internal cooling circuit 110 (shown schematically; FIG. 4) will be described and illustrated in detail, other hot section components including, but not limited to, vanes, turbine shrouds, end walls, BOAS, combustors, and other such components will also benefit here from either with or without internal cooling circuits 110. Embedding the resonant optical probe system 206 inside the component prevents damage (e.g. peel off, corrosion etc.) to the probe system 206 due to harsh environmental conditions (e.g., high pressure, high temperature gas flow, foreign particles etc.). In addition, the probe system 206 will not affect the aerodynamics of the part like a coating or painted material would do. Preventing the exposure of the probe system 206 to engine harsh environment also reduces material compatibility issues (e.g. potential contamination of engine parts due to a new probe material degrading over time etc.) and provide additional flexibility when selecting probe materials.

The control system 202 may include at least one processor 220 (e.g., a controller, microprocessor, microcontroller, digital signal processor, etc.), memory 222, and an input/output (I/O) interface 224. The processor 220 and the I/O interface 224 are communicatively coupled to the memory 222. The memory 222 may be embodied as any type of computer memory device (e.g., volatile memory such as various forms of random access memory) which stores data and control algorithms such as the logic described herein. The I/O interface 224 is communicatively coupled to a number of hardware, firmware, and/or software components, including, for example, the remote systems 120 such as a ground station, Health and Usage Monitoring Systems (HUMS), condition-based maintenance (CBM) system, or other system. Numerous systems may use a condition-based maintenance (CBM) philosophy where sensor input is used to schedule maintenance rather than scheduled maintenance to reduce maintenance labor burden and associated costs.

Figure 5:
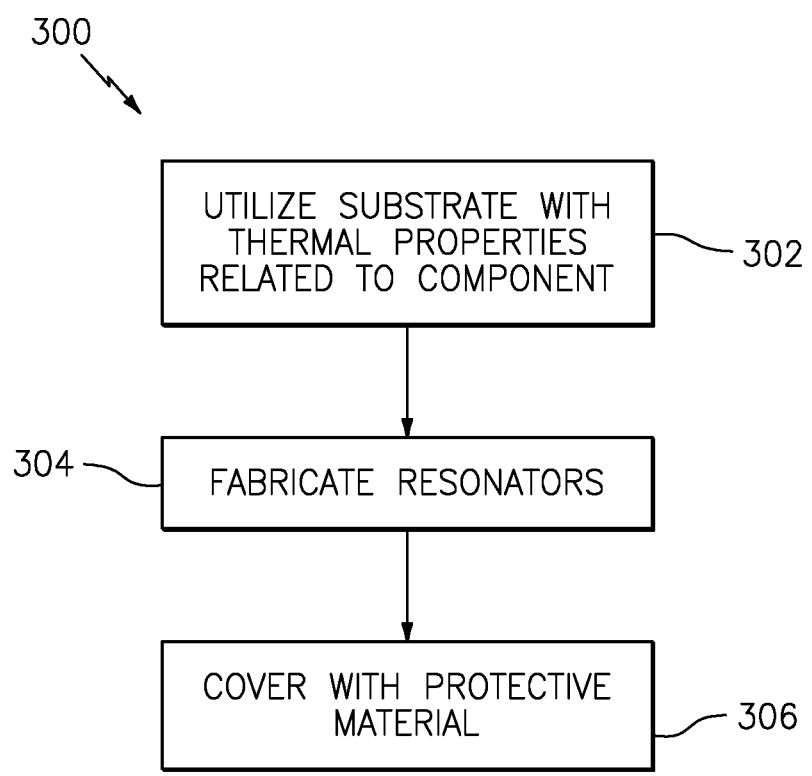
FIG. 5 is a block diagram illustrating manufacture of a resonant probe according to one non-limiting embodiment.
Figure 6:
FIG. 6 is a schematic view of a first step in manufacture of the resonant probe.

With reference to FIG. 5, a method 300 for manufacture of the resonant probes 210 initially includes utilization of a substrate 250 with thermal properties matching the host material of the blade 84 or other component (302; FIG. 6). The substrate can be, for example sapphire, MgO, etc. when optical transparency is needed. Otherwise the substrate material can be the same as the component material, with a variation in microstructure and composition, to reduce mismatch in thermal properties. When the probe substrate is the same as the component material, additional surface smoothing may be applied.

Figure 7:
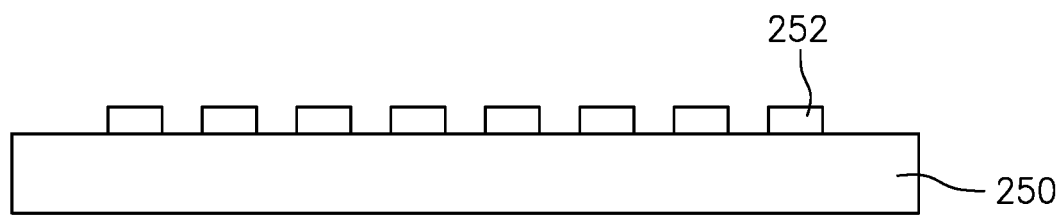
FIG. 7 is a schematic view of a second step in manufacture of the resonant probe.

Next, optical resonators 252 are applied, with, for example, thin film deposition and patterning techniques to provide, for example, micro/nano structures (step 304 of FIG. 5, and see also FIG. 7). The optical resonators 252 can include, for example, metals, metal alloys, metalloids, intermetallics, ceramics, carbon-based materials and other metallic materials such as titanium nitride, zirconium nitride etc., and the dielectric materials can include, for example, $SiO_2$, $Si_3N_4$, SiC, synthetic diamonds, etc. There need be no difference between dielectric and metallic nanostructures or thin films in terms of fabrication. Both can be manufactured following similar steps and equipment—usually a mixture of patterning (e.g. lithography and etching) and film deposition techniques (physical vapor deposition, chemical vapor deposition, etc).

Figure 8:
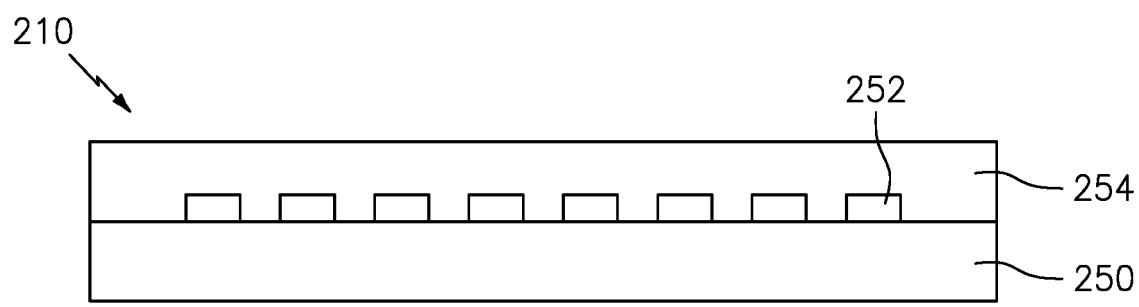
FIG. 8 is a schematic view of another step in manufacture of the resonant probe.

Next, the optical resonators 252 are covered with a protective material 254 to encapsulate the optical resonators 252 (step 306 in FIG. 5, see also FIG. 8). One or both of the substrate 250 and the protective material 254 may be transparent in the desired wavelength ranges that will be used for measurement.

The resonant probes 210 are essentially antennas for light. Changes in temperature affect the optical properties of the resonant probes 210 such that application of a spectral source from the optical emitter/receiver 204 results in a change in reflected electromagnetic radiation spectrum and amplitude. The optical resonators 252 are designed for resonance in the spectral regions of interest; which can be determined by a variety of factors including background radiation noise, transmission/scattering/absorption properties of the working environment, etc. Changes in temperature thereby result in a change in reflected signal.

Figure 9:
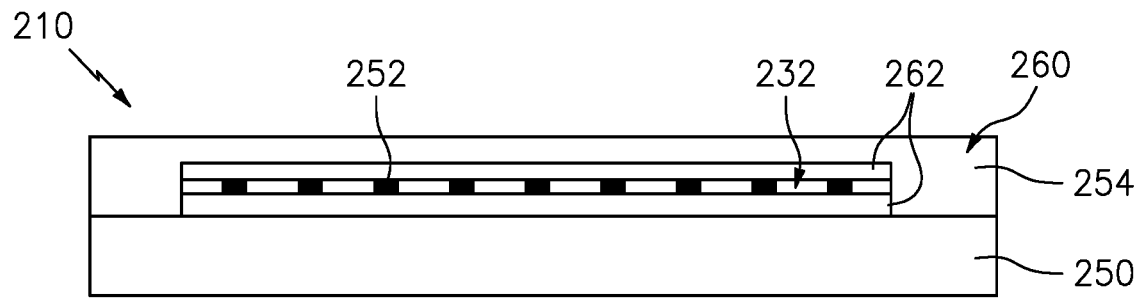
FIG. 9 is a schematic view illustrating manufacture of a resonant probe according to another non-limiting embodiment.

In another embodiment, a stack of thin film optical materials 260 (FIG. 9) can be utilized as the resonant probe 210 to provide cavity resonances. Changes in the optical property and thickness of individual layers as a function of temperature can be employed for temperature sensing based on reflection of the incident electromagnetic energy from the emitter/receiver.

The resonant probes can include one or more components made of luminescent materials, such as thermographic phosphors, that indicate changes in temperature via a change in the luminescence signal. Luminescent material can be applied as an addition to thin film cavity resonators or nanostructured antenna resonators to enhance the sensing capabilities. Luminescent material can also be applied without other resonating structures to act as the single source of temperature indicating signal. Luminescence data provides a change in temporal response whereas reflection data provides a change in spectral response. Therefore, these two mechanisms can be used together for enhanced measurement capabilities.

In another embodiment, the resonant probe 210 can include a stacked thin film resonant cavity, 260, (e.g. Fabry-Perot or etalon) to define field localization and reflection/absorption/transmission resonance peaks. Two semi-transparent metallic thin films, 262, with thicknesses ranging between 1 nm to 50 nm form the cavity walls and a thermographic phosphor 232 fills the optical cavity with thickness ranging from 1 nm to 5 micrometer. Multiple films and cavities can be combined to provide additional resonance bands.

Resonant nano/micro-structures 252 (FIG. 8) (e.g., metal nanodisks with a diameter ranging from 10 nm to 1 micrometer, and a height ranging from 5 nm to 1 micrometer) can be further embedded into the thermographic phosphor 232 to provide additional sensing capabilities. The entire resonant probe can be built on a substrate material that is the same as the additively manufactured component (e.g. IN-738 for an Inconel blade) with a surface roughness ranging from 0.3 nm to 100 nm. The resonant probe 210 can be further encapsulated with an $Al_2O_3$ film of thickness ranging from 10 nm to 5 micrometer.

Figure 10:
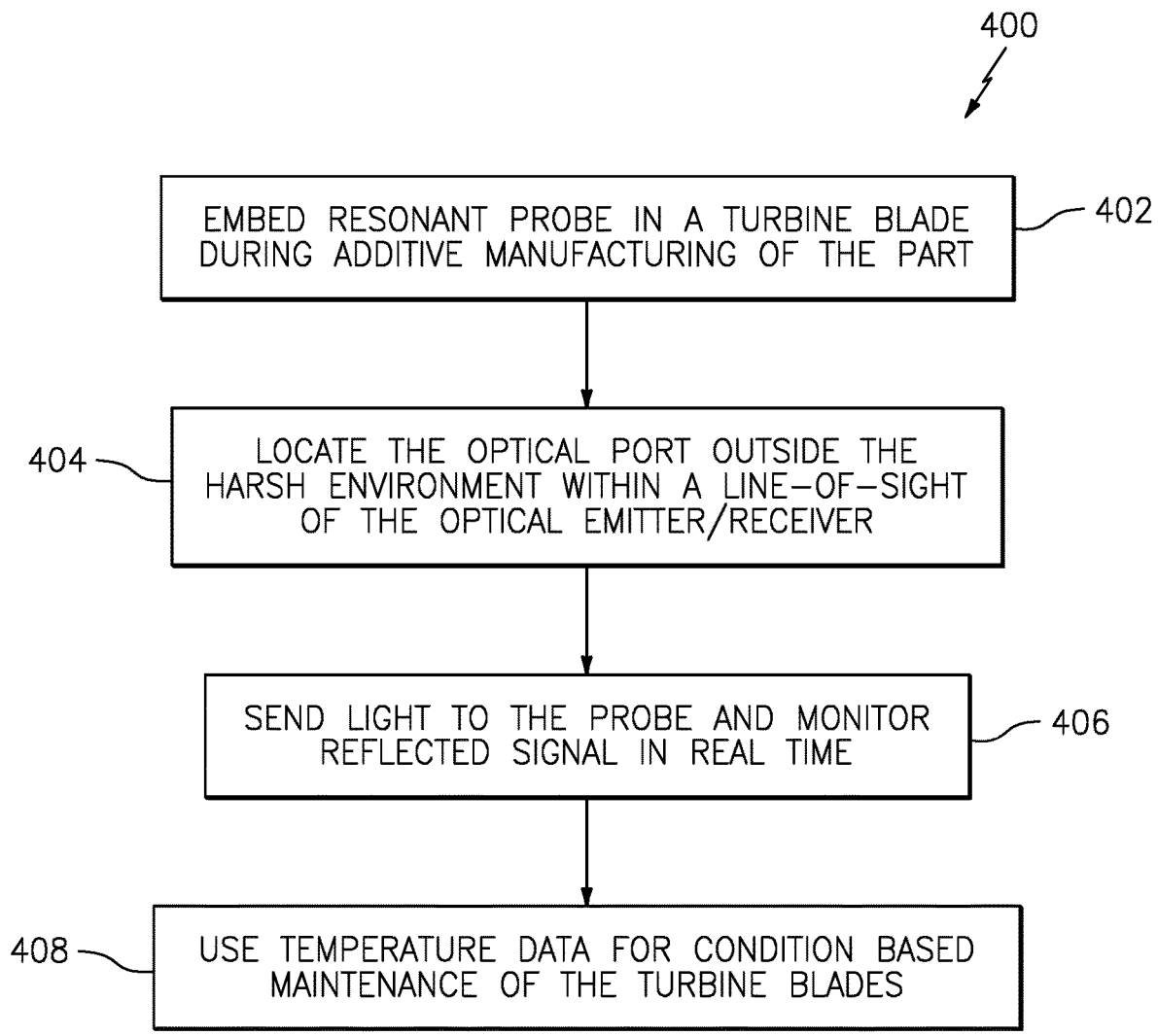
FIG. 10 is a block diagram illustrating operation of the remote temperature measurement system.

With reference to FIG. 10, a method 400 for operation of the remote temperature measurement system 200 is disclosed in terms of functional block diagrams. The functions of the logic are programmed software routines capable of execution in various microprocessor based electronics control embodiments and represented herein as the block diagrams. These functions may be enacted in either dedicated hardware circuitry or programmed software routines capable of execution in a microprocessor-based electronics control embodiment.

In one embodiment, the resonant probe 210 is embedded in a component of interest (402) such that the optical port 212 is within a line-of-sight of the optical emitter/receiver 204 (404). The optical emitter/receiver 204 may thereby be located outside of a relatively harsh environment that is to be monitored.

The optical emitter/receiver 204 communicates with the optical port 212 which guides the electromagnetic beam to the resonant probe 210 via the waveguide 214 (406). The optical emitter/receiver 204 then monitors the reflected signal in real time for interrogation by the control system 202 to calculate temperature data.

Figure 11:
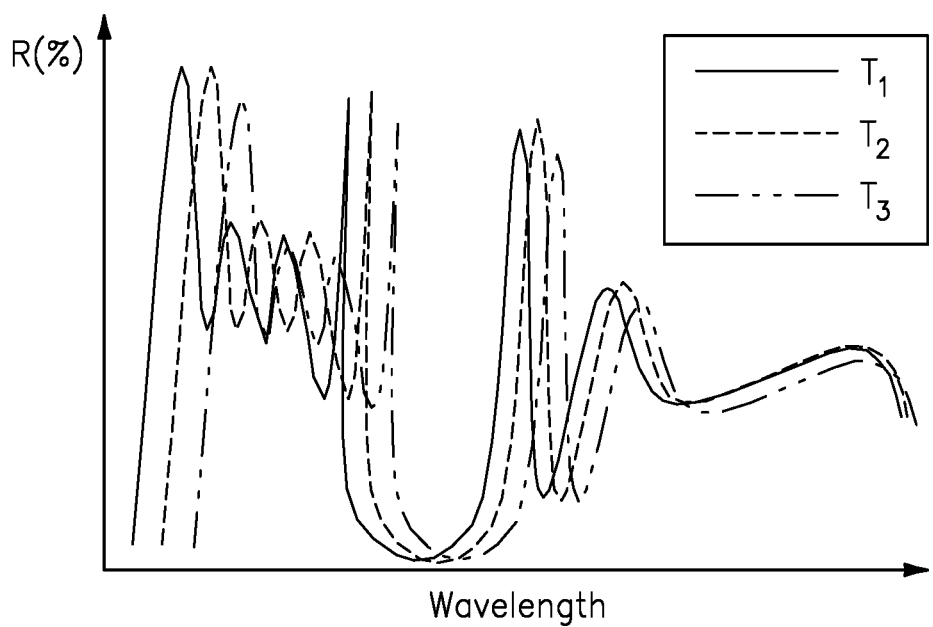
FIG. 11 is a graphical representation of temperature data from the remote temperature measurement system in a reflection mode.

In one embodiment, the control system 202 may operate in a reflection mode. The reflection mode may utilize electromagnetic radiation with a broad spectrum that is communicated to the resonant probe 210. The resonant probe 210 has certain resonant reflection peak and dips that are defined by design. These resonances shift as a function of temperature. Measuring the reflected signal permits real time measurement of the current temperature of the resonant probe 210 and surrounding medium to obtain the temperature data (FIG. 11).

Figure 12:
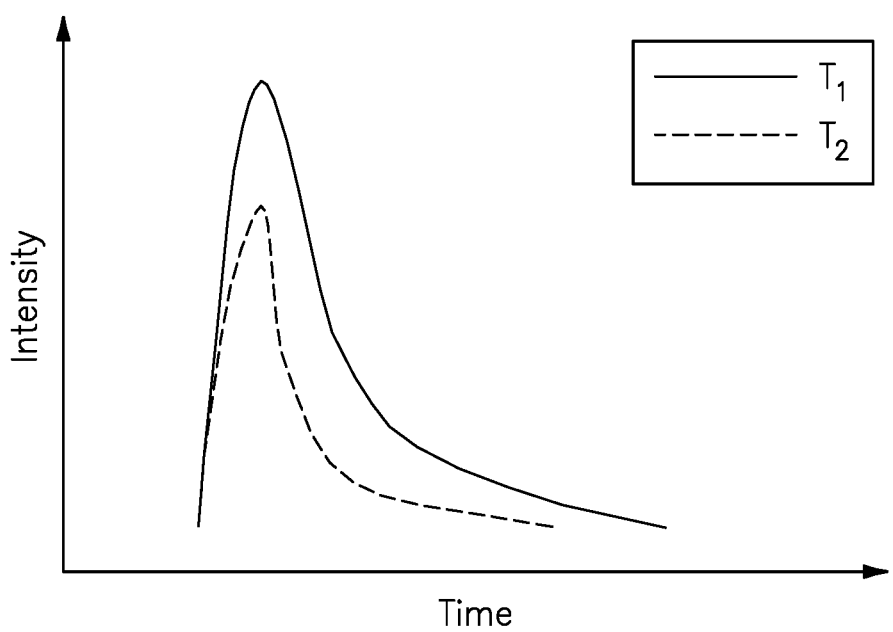
FIG. 12 is a graphical representation of temperature data from the remote temperature measurement system in a luminescence mode.

In another embodiment which utilizes an optical material such as the thermographic phosphors, the control system 202 may operate in a luminescence mode. The luminescence mode utilizes pulsed monochromatic (single wavelength) electromagnetic radiation that is sent on to the resonant probe 210 and absorbed by the luminescent material. Decaying electromagnetic radiation with lower energy is emitted by the resonant probe 210. The decay characteristics (intensity) of the emitted electromagnetic radiation is a function of temperature and it can be used to measure the temperature of the resonant probe 210 and surrounding material to obtain the temperature data (FIG. 12).

Algorithms established in the control system then utilize the temperature data for condition-based maintenance, reduced product development cycle, design optimization, or other analysis of the component (404).

The remote temperature measurement system 200 uses engineered resonant optical probes embedded in additively manufactured components for real time remote temperature measurement via free-space coupling of electromagnetic probes that enables access to moving parts. In addition to wear/rub surfaces, other static components that become hot from aerothermal heating or combustion such as leading edges, fins, inlets, cowls, combustor walls, exhausts, isolators of ramjets, scramjets, rotation detonation engines, rocket motors, etc., may also benefit herefrom. Other locations within harsh environments applications including ground turbines, power plants (coal and other), industrial furnaces, drilling tools/applications, hypersonic vehicle sensing. The free-space approach allows the use of a broad electromagnetic spectrum with an additional degree of freedom to address application-specific concerns such as background radiation, or signal attenuation due to operational environment (e.g., soot and gas absorption). Resonant probes leverage both temperature dependence of inherent material properties (e.g. dielectric constant, fluorescent lifetime) and structural engineering (e.g. antennas, gratings, cavities) for enhanced, real-time sensing. The free space coupling enables measurements from parts otherwise inaccessible (e.g., extreme conditions, moving parts). Real-time accurate measurements using resonant optical probes in extreme environments provide critical information for improved design (e.g., higher efficiency, smaller safety margins) and accurate maintenance schedules (e.g., increased reliability and availability factors, minimized forced outage rates and mean time to repair, minimized secondary failures).

Although particular step sequences are shown, described, and claimed, it should be appreciated that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in electromagnetic radiation of the above teachings will fall within the scope of the appended claims. It is therefore to be appreciated that within the scope of the appended claims, the disclosure may be practiced other than as specifically described. For that reason the appended claims should be studied to determine true scope and content.

What is claimed is:

1. A remote temperature measurement system comprising:
   a control system;
   an optical emitter/receiver in communication with the control system; and
   a probe system embedded within a component of a gas turbine engine, the probe system comprising a resonant probe embedded within the component and in communication with an optical port of the component via a waveguide, the optical port being within a line-of-sight of the optical emitter/receiver, the control system operable to determine a local temperature of the component in response to optical communication of the optical emitter/receiver with the probe system, wherein the resonant probe comprises thermographic phosphor film in which changes in temperature affects the luminescence of the thermographic phosphor film, and wherein the resonant probe comprises a nano/micro structured resonator.

2. The system as recited in claim 1, wherein the component is a rotor blade.

3. The system as recited in claim 1, wherein the resonant probe is embedded below a surface of the component.

4. The system as recited in claim 1, wherein the resonant probe t operates as an antenna for light.

5. The system as recited in claim 1, wherein the resonant probe comprises a material designed for resonance in a desired spectral region.

6. The system as recited in claim 1, wherein the resonant probe comprises dielectric materials designed for resonance in a desired spectral region.

7. The system as recited in claim 1, wherein the component is additively manufactured.

8. A probe system embedded within a component of a gas turbine engine, comprising:
   a resonant probe embedded within the component;
   an optical port in a surface of the component; and
   a waveguide in communication with the resonant probe and the optical port, wherein the resonant probe further comprises a thermographic phosphor film in which changes in temperature affects the luminescence of the thermographic phosphor films and optical properties thereof, and wherein the resonant probe comprises a nano/micro-structured resonator.

9. The probe system as recited in claim 8, wherein the resonant probe comprises dielectric materials designed for resonance in a spectral region of interest.

10. A method for remote temperature measurement of a component within a gas turbine engine, comprising:
- embedding a probe system within an additively manufactured component of the gas turbine engine;
- optically communicating with the probe system from external of the component, through an optic port in the component and a waveguide leading from the optic port within the component to the probe system; and
- determining a local temperature of the component in response to optical communication with the probe system, wherein the probe system comprises a thermographic phosphor film, and wherein the step of optical communication with the probe system comprises determining a luminescence of the thermographic phosphor film in the probe system, and wherein the probe system comprises a resonant probe comprising a nano/micro structured resonator.

11. The method as recited in claim 10, wherein communication with the probe system comprises optical communication from a fixed location relative to the additively manufactured component.

12. The method as recited in claim 10, wherein determining the local temperature of the component in response to optical communication with the probe system comprises utilizing at least one of a reflection mode and a luminescence mode.

* * * * *